United States Patent
Reedy et al.

(10) Patent No.: US 6,690,056 B1
(45) Date of Patent: Feb. 10, 2004

(54) EEPROM CELL ON SOI

(75) Inventors: Ronald E. Reedy, San Diego, CA (US); James S. Cable, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 09/420,952

(22) Filed: Oct. 19, 1999

Related U.S. Application Data

(60) Provisional application No. 60/128,170, filed on Apr. 6, 1999.

(51) Int. Cl.[7] .................. H01L 29/76; H01L 29/788; H01L 29/94; H01L 31/113; H01L 31/119
(52) U.S. Cl. .................. 257/314; 257/315; 257/318; 257/321; 257/322; 257/347
(58) Field of Search .................. 257/314, 315, 257/318, 321, 322, 347, 350, 351, 352

(56) References Cited

U.S. PATENT DOCUMENTS

| | | | |
|---|---|---|---|
| 3,500,142 A | 3/1970 | Kahng | |
| 3,562,608 A | 2/1971 | Gallagher et al. | |
| 3,829,881 A | 8/1974 | Kohashi | |
| 3,840,888 A | 10/1974 | Gaensslen et al. | 357/42 |
| 3,919,711 A | 11/1975 | Chou | |
| 3,996,657 A | 12/1976 | Simko et al. | |
| 4,142,251 A | 2/1979 | Mintz | |
| 4,198,649 A | 4/1980 | Berry | |
| 4,724,530 A | 2/1988 | Dingwall | |
| 4,843,448 A | 6/1989 | Garcia et al. | |
| 5,027,171 A | 6/1991 | Reedy et al. | |
| 5,300,443 A | 4/1994 | Shimabukuro et al. | |
| 5,411,905 A | 5/1995 | Acovic et al. | |
| 5,416,043 A | 5/1995 | Burgener et al. | |
| 5,455,791 A | 10/1995 | Zaleski et al. | |
| 5,492,857 A | 2/1996 | Reedy et al. | |
| 5,552,621 A | 9/1996 | Kowalski | |

(List continued on next page.)

FOREIGN PATENT DOCUMENTS

| | | | |
|---|---|---|---|
| EP | 0516516 A1 | 12/1992 | |
| EP | 0570257 A1 | 11/1993 | |
| EP | 0896370 | 2/1999 | 257/316 |
| JP | 56021371 | 2/1981 | |

OTHER PUBLICATIONS

Gaensslen et al., "Field–Effect Transistor Device", IBM Technical Disclosure Bulletin, vol. 13, No. 11, Apr. 1971.

Primary Examiner—Jerome Jackson
Assistant Examiner—Jesse A. Fenty
(74) Attorney, Agent, or Firm—Steven J. Hultquist; Marianne Fuierer; Yongzhi Yang

(57) ABSTRACT

A non-volatile storage cell manufactured in a standard CMOS process in silicon on insulator is described. The cell is manufactured in a standard single polysilicon layer CMOS process applied to silicon on insulator starting substrates. Two versions of the cell are described with distinct mechanisms for writing onto a floating polysilicon layer storage node. The basic cell comprises crossed N- and P-transistors which share a common channel region and a common floating gate over the channel. Current in the channel results in charge injection through the gate oxide and onto the polysilicon gate conductor where it is permanently stored. Since both N and P type transistors are available, charge of both polarities can be injected. Application of a voltage to either of the transistors results in a current or voltage which is used to perform the reading function. Multiple variations of the cell and its operation are also described along with unique applications of the cell.

67 Claims, 7 Drawing Sheets

U.S. PATENT DOCUMENTS

| | | | |
|---|---|---|---|
| 5,572,040 A | 11/1996 | Reedy et al. | |
| 5,587,947 A | 12/1996 | Chang et al. | |
| 5,596,205 A | 1/1997 | Reedy et al. | |
| 5,600,169 A | 2/1997 | Burgener et al. | |
| 5,619,450 A | 4/1997 | Takeguchi | |
| 5,656,845 A * | 8/1997 | Akbar | 257/347 |
| 5,663,570 A | 9/1997 | Reedy et al. | |
| 5,689,459 A | 11/1997 | Chang et al. | |
| 5,691,552 A | 11/1997 | Oyama | 257/316 |
| 5,721,440 A | 2/1998 | Kowalski | |
| 5,780,341 A | 7/1998 | Ogura | |
| 5,847,993 A | 12/1998 | Dejenfelt | 365/185.1 |
| 5,861,336 A | 1/1999 | Reedy et al. | |
| 5,863,823 A | 1/1999 | Burgener | |
| 5,883,396 A | 3/1999 | Reedy et al. | |
| 5,886,376 A | 3/1999 | Acovic et al. | |
| 5,895,957 A | 4/1999 | Reedy et al. | |
| 5,914,513 A | 6/1999 | Shenai et al. | |
| 5,930,638 A | 7/1999 | Reedy et al. | |
| 5,973,363 A | 10/1999 | Staab et al. | |
| 5,973,382 A | 10/1999 | Burgener et al. | |
| 6,057,555 A | 5/2000 | Reedy et al. | |
| 6,093,623 A * | 7/2000 | Forbes | 438/455 |
| 6,201,267 B1 * | 3/2001 | Gupta et al. | 257/206 |
| 6,252,275 B1 * | 6/2001 | Aitken et al. | 257/318 |
| 6,291,855 B1 * | 9/2001 | Chang et al. | 257/316 |
| 6,329,685 B1 * | 12/2001 | Lee | 257/314 |
| 6,396,108 B1 * | 5/2002 | Krivokapic et al. | 257/365 |

* cited by examiner

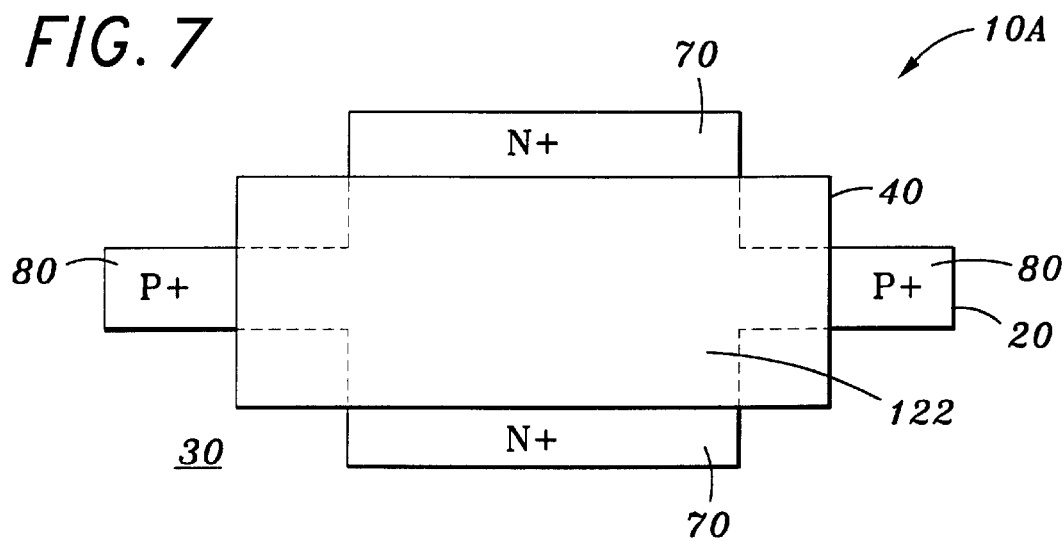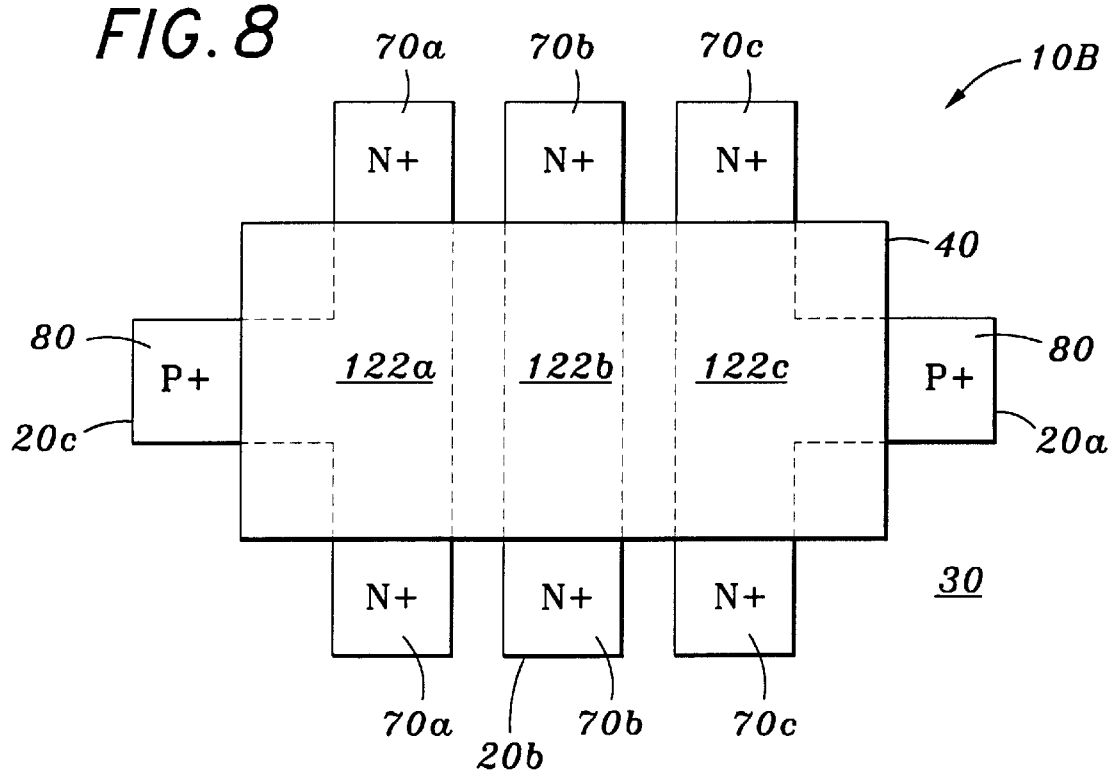

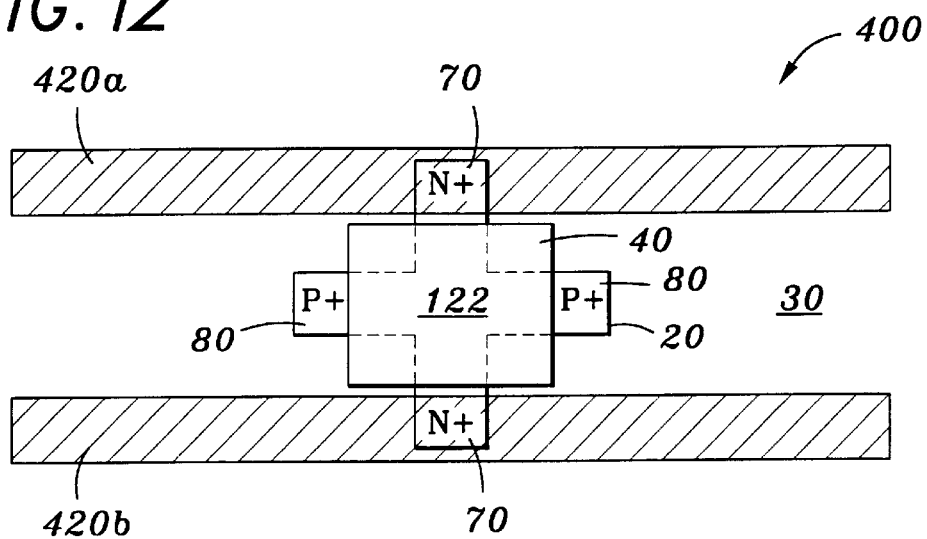
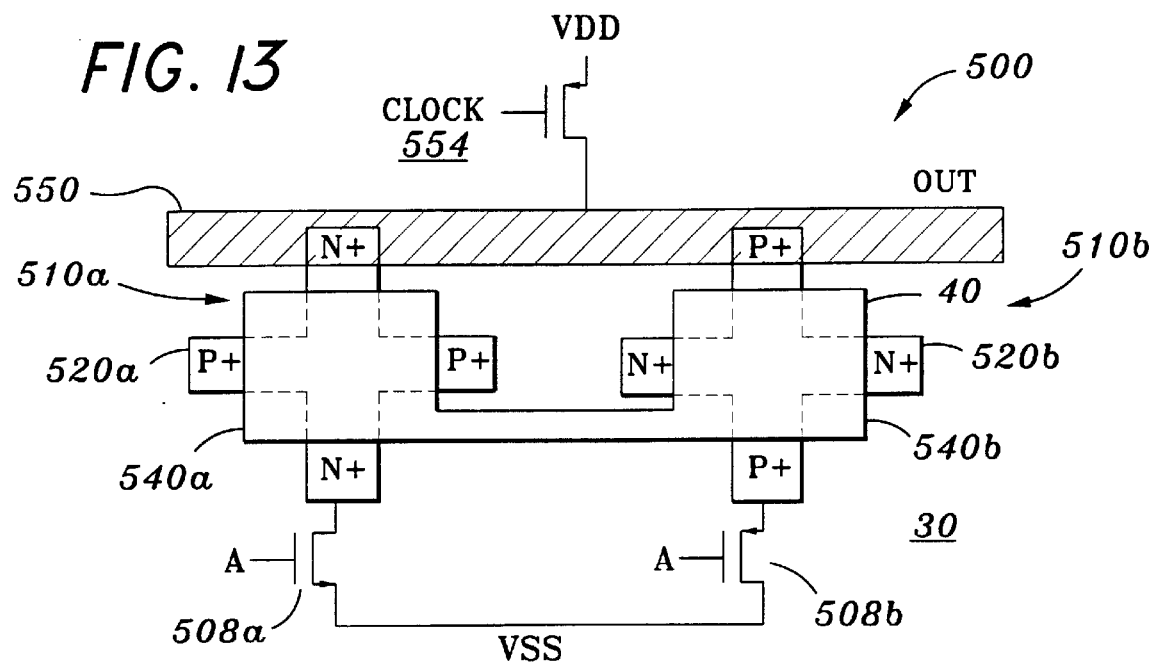

EEPROM CELL ON SOI

RELATED APPLICATION

This patent application claims the benefit of U.S. Provisional Application Serial No. 60/128,170, which was originally filed on Apr. 6, 1999.

FIELD OF THE INVENTION

The invention relates to the field of floating gate devices on Silicon On Insulator (SOI).

BACKGROUND OF THE INVENTION

General

Electronic devices perform several functions, including digital, analog and memory. Memory devices fall into two broad categories: volatile and non-volatile, with the distinction that volatile memory loses its information when power is removed while non-volatile memory does not.

Multiple types of non-volatile (NV) memory have been used over the years, with the most common based on magnetic devices such as magnetic core, tape or discs or optical devices such as CD-ROM. Such devices offer high density and low cost, but cannot be integrated onto integrated circuits. They are therefore typically used in computer systems as separate modules, but cannot provide non-volatile memory as an integral part of an integrated circuit, or chip.

Including non-volatile storage of information on board a chip has become increasingly important. With such capability, standard chips can be permanently programmed to perform specialized functions; variable coefficients can be permanently stored; and critical data can be backed up during operation to improve system reliability. Additionally, on-chip NV memory enables a single chip to be manufactured in large volume for multiple markets, with customization provided by programming, either at the manufacturer or by the customer. This provides cost efficiency from the large volume production to lower volume, customized applications. NV memory is particularly important for battery operated systems such as cellular phones and portable consumer electronics where both customization and information storage is required and must survive complete loss of power.

Uses of on-chip NV memory continue to expand with its availability. Many wireless systems require significant permanent customization to set radio performance specifications (e.g., frequency plans, gain levels, internal operating conditions, A/D performance, account information, security codes and software changes or upgrades). New markets include so-called IC cards used as credit cards, pre-paid purchase cards, medical records storage and RF ID tags. Other new applications include content addressable memory, security verification, package tracking, commercial satellites and many more. The key to these new applications is to be able to include NV memory with as many other microelectronic functions as possible.

Storage Cells

The original NV memory was commonly called Floating-gate Avalanche-injection MOS (FAMOS) and is described in U.S. Pat. Nos. 3,500,142 and 3,919,711. In this device, a polysilicon gate transistor was made without electrical contact to the gate conductor. By applying a high voltage to the drain of an N-channel transistor, small currents were amplified through avalanche gain, creating high energy (or "hot") electrons or holes. The combination of high energy and large voltage on the drain forced some of the carriers to penetrate through the gate oxide and onto the electrically floating polysilicon gate conductor. Once charged, the gate maintained the transistor in a conducting, or "on", state which represented a stored bit of information. Initial products were based on bulk Si PMOS transistors storing electrons on the gate. However, no integrated electrical mechanism was available to inject electrons or to remove holes thereby providing an erase function.

While effective at writing, the lack of an electronic mechanism to erase or remove the stored charge was a severe limitation. Hence, this class of device became known as an Electrically Programmable Read Only Memory, or EPROM. The erasing mechanism devised was to apply ultraviolet light which gave the stored charge sufficient energy to return to the silicon and be dissipated, hence the name UVEPROM. UV erasing was time consuming, required special equipment and device packaging and perhaps worst of all, it required removal of the device from the system for reprogramming. The value of NV memory was so great that these drawbacks did not prevent UVEPROM from becoming a very successful product. However, the drawbacks led to a search for a next generation of device, the Electrically Erasable PROM, called EEPROM or $E^2$PROM and often referred to simply as E-squared. By providing electrically erasable memory, the UV light, special packaging and removal requirements were eliminated and NV memory became an industry segment unto itself, spawning numerous companies.

In EEPROM, a second polysilicon layer is placed above or near the floating storage node and separated by a very thin, high quality silicon dioxide layer, as described in many U.S. Patents, including U.S. Pat. Nos. 3,996,657, 5,587,947 and 5,689,459. Writing occurs by applying a drain source voltage of sufficient magnitude to create source-drain current with channel hot electrons (CHE) of sufficient energy and momentum to penetrate the gate oxide. Erasing occurs by applying a high voltage to the second gate, sufficiently high electric fields can be generated to induce the quantum mechanical tunneling phenomenon (Fowler-Nordheim), in which a charged particle penetrates a thin insulating layer. With the second gate, an electrical erasing mechanism is integrated onto the chip, thereby eliminating the need for UV light and more importantly, allowing in-system re-programming. However, process complexity increases and on-chip high voltages have to be generated, controlled and routed. The high electric field eventually causes damage to the thin oxide layer, creating reliability issues. Also, the erasing mechanism is an inherently unstable process which can cause over-erasing (and subsequent under-writing) and other problems. Sophisticated control circuits are required to ensure proper operation.

Multiple variations on the EEPROM writing and erasing mechanisms have been defined and used. Processing and layout details affect performance, speed and reliability. Control of the thin oxide layers must be to the highest standards, often limiting yield and manufacturability. Many large chips, such as high performance microprocessors and digital signal processors would benefit from inclusion of EEPROM, but the process and design complexity can make this prohibitively expensive. However, in specialized processing facilities, large NV memory chips known as Flash memory use a variation of EEPROM storage cells and are manufactured cost effectively.

A recent variation on the standard EEPROM cell is the so-called stepped channel device, as described in U.S. Pat. No. 5,780,341. In this cell, a shallow step is introduced into the channel region of the writing transistor, making the drain slightly lower than the source. As electrons transit from source to drain, they encounter the step. The step enhances CHE injection mechanism thereby completing the writing mechanism at lower voltage. The detailed mechanisms are described in the references, but can be thought of as a microscopic solid state electron implanter. By adjusting the size and location of the step along with the transistor design, electrons can be written effectively. However, this still leaves the requirement to erase the cell, which is done by conventional Fowler-Nordheim tunneling as found in conventional EEPROM.

Processes

EEPROM storage cells are inherently MOS devices and can be integrated into any MOS process. However, the high voltages necessary for programming add additional requirements to the process to deal with routing of the high voltage signals. In standard CMOS, regions between transistors are called the field and constitute a parasitic MOS transistor. If this region is improperly designed so-called field inversion can occur, thereby improperly shorting together two or more adjacent transistors. High voltage on interconnects increases this problem and forces changes to the CMOS process. Additionally, CMOS circuits can exhibit a phenomenon known as latch-up in which a large, stable current can be triggered which can either destroy the chip or at least force power down. Modern CMOS processes normally designed to handle 3 V or less must therefore be modified significantly to enable them to handle the high programming voltages if EEPROM cells are to be added. Additionally, transistors and other circuit elements (often called charge pump circuits) must be included to create and route the high voltage signals. These elements must themselves be designed to handle the high voltage and the silicon substrate must also be designed to deal with substrate currents induced by the signals. In short, adding EEPROM circuitry to standard CMOS requires a great deal of design and process technology which in turn increases complexity and cost. Even with the greatest care and effort, many companies have failed at creating cost effective EEPROM.

Since many of the problems associated with integrating EEPROM with standard CMOS arise from interactions with the Si substrate, an ideal process for this task is silicon on insulator, or SOI. SOI is a structure in which a silicon film is formed on an insulating layer or substrate. CMOS on SOI enables completely dielectric isolation of each transistor, thereby eliminating silicon laterally from the field regions and associated field inversion problems. The insulating layer below each transistor is also incapable of supporting substrate current, especially those created by high voltage circuitry and signals. Three US patents discuss EEPROM on SOI: 5,411,905; 5,455,791 and 5,886,376. In all three patents, a traditional Fowler-Nordheim mechanism is described based on a floating gate and a capacitively coupled control gate.

SOI structures also provide opportunities to use transistors in different ways, since source and drain junctions cannot be forward biased to the substrate. Such flexibility can permit circuit topologies not permitted in bulk Si CMOS. It also simplifies charge pump design.

SUMMARY OF THE INVENTION

Since its first invention, it has been recognized that a low voltage EEPROM cell manufactured without additional processing steps would be an ideal solution. With such a cell, NV memory could be integrated into virtually all CMOS circuitry by standard design techniques. Lower voltage operation would reduce the need for high voltage circuitry, and improve reliability of the thin oxide layer. The term low voltage means low compared to the traditional writing and erasing voltages of up to 19 V, as is currently common in the industry. It is desirable to have a minimum voltage for writing to the cell, at least above the voltages typically used to operate the rest of the chip's circuitry. This is for the obvious reason that it provides protection against standard control signals inadvertently writing information into the storage cells.

An ideal cell would also be able to write and erase in a controlled, measurable fashion, thereby reducing the risk of over-erasing. The tunneling injection mechanisms currently used are exponentially non-linear forcing tight process and circuit controls to ensure proper writing and erasing. Finally, low voltage operation reduces power consumption and meets the constant need to reduce voltages of virtually all modern electronic systems.

SOI embodiments would have higher speed and some reduced high voltage sensitivity, but the basic logic and storage cells can be the same as those described for bulk Si. However, SOI offers a degree of freedom not available in bulk silicon: each transistor is electrically isolated from each other which enables a unique cell construction and erasing mechanism which provides the long-sought integratable EEPROM cell without additional processing layers.

These and other desirable characteristics are embodied in the present invention.

In a first aspect, the present invention is a semiconductor device comprising: an island of semiconductor material on an insulating substrate; a first electronic device of a first conductivity type fabricated in the island of semiconductor material, the first electronic device comprising: a first device source region; a first device drain region; and a first device channel region positioned between the first device source region and the first device drain region, wherein a portion of the first device channel region is a common channel region; and a second electronic device of a second conductivity type fabricated in the island of semiconductor material, the second electronic device comprising: a second device source region; a second device drain region; and a second device channel region positioned between the second device source region and the second device drain region, wherein a portion of the second device channel region includes the common channel region. The device may further include a common floating gate positioned over at least a portion of each of the first device channel region and the second device channel region, the common floating gate further comprising: a gate insulating layer positioned adjacent the common channel region; and a gate conductive layer positioned adjacent the gate insulating layer. In some configurations, the gate insulating layer may further comprise an oxide layer and the gate conductive layer may further comprise a polysilicon layer. In some configurations, the semiconductor device may further comprise an injector, the injector comprising a region wherein the common floating gate penetrates into the common channel region such that the injector is surrounded by the common channel region. In some configurations, the semiconductor device further comprises an Electrically Erasable Programmable Read Only Memory, called EEPROM, device. In some configurations, the semiconductor material further comprises silicon. In some configurations, the insulating substrate further comprises sapphire. In some configurations, the insulating substrate further comprises a layer of silicon dioxide.

In a second aspect, the present invention is a semiconductor device comprising: a first island of semiconductor material on an insulating substrate wherein the first island of semiconductor material further comprises: a first region and a second region of a first conductivity type separated by a first channel region positioned between the first and second regions; and a third region of a second conductivity type which is adjacent to the first channel region; a second island of semiconductor material on the insulating substrate wherein the second island of semiconductor material further comprises a fourth region and a fifth region of the first conductivity type separated by a second channel region positioned between the fourth and fifth regions; a third island of semiconductor material on the insulating substrate wherein the third island of semiconductor material further comprises: a sixth region and a seventh region of the first conductivity type separated by a third channel region positioned between the sixth and seventh regions; and an eighth region of the second conductivity type which is adjacent to the third channel region; and a floating gate common to the first, second and third channel regions, the common floating gate further comprising: a gate insulating layer positioned adjacent the first, second and third channel regions; and a gate conductive layer positioned adjacent the gate insulating layer. The device may further comprise an injector, the injector comprising a region wherein the common floating gate penetrates into at least one of the first, second or third channel regions. In some configurations, the semiconductor material further comprises silicon. In some configurations, the insulating substrate further comprises sapphire. In some configurations, the insulating substrate further comprises a layer of silicon dioxide.

In a third aspect, the present invention is a multiport semiconductor device comprising: an island of semiconductor material on an insulating substrate wherein the island of semiconductor material further comprises: a first region and a second region of a first conductivity type separated by a first channel region positioned between the first and second regions; a third region of a second conductivity type which is adjacent to the first channel region; a fourth region and a fifth region of the first conductivity type separated by a second channel region positioned between the fourth and fifth regions; a sixth region of the second conductivity type which is adjacent to the second channel region; and a floating gate common to the first and second channel regions. In some configurations, the common floating gate further comprises: a gate insulating layer positioned adjacent the first and second channel regions; and a gate conductive layer positioned adjacent the gate insulating layer. The device may further include an injector, the injector comprising a region wherein the common floating gate penetrates into at least one of the first or second channel regions. In some configurations, the semiconductor material further comprises silicon. In some configurations, the insulating substrate further comprises sapphire. In some configurations, the insulating substrate further comprises a layer of silicon dioxide.

In a fourth aspect, the present invention is an EEPROM cell with integrated inverter serving as a latching sense amplifier semiconductor device, the device comprising: an EEPROM cell formed on a first island of semiconductor material on an insulating substrate wherein the EEPROM cell further comprises: a first region and a second region of a first conductivity type separated by a first channel region positioned between the first and second regions; and a third region of a second conductivity type which is adjacent to the first channel region; an inverter configured as a latching sense amplifier comprising: a second island of semiconductor material on the insulating substrate wherein the second island of semiconductor material further comprises a fourth region and a fifth region of the first conductivity type separated by a second channel region positioned between the fourth and fifth regions; and a third island of semiconductor material on the insulating substrate wherein the third island of semiconductor material further comprises a sixth region and a seventh region of the second conductivity type separated by a third channel region positioned between the sixth and seventh regions, wherein a voltage $V_{ss}$ is applied to the fourth region of first conductivity type, a voltage $V_{dd}$ is applied to the sixth region of second conductivity type, and the fifth region of first conductivity type and the seventh region of second conductivity type are interconnected as an output for the latching sense amplifier; and a floating gate common to the first, second and third channel regions. The device may further include an injector, the injector comprising a region wherein the common floating gate penetrates into one or more of the first, second or third channel regions. In some configurations, the semiconductor material further comprises silicon. In some configurations, the insulating substrate further comprises sapphire. In some configurations, the insulating substrate further comprises a layer of silicon dioxide.

In a fifth aspect, the present invention is an EEPROM cell with integrated NAND gate semiconductor device, the device comprising: a first EEPROM cell formed on a first island of semiconductor material on an insulating substrate wherein the first EEPROM cell further comprises: a first region and a second region of a first conductivity type separated by a first channel region positioned between the first and second regions; and a third region of a second conductivity type which is adjacent to the first channel region; a second EEPROM cell formed on a second island of semiconductor material on the insulating substrate wherein the second EEPROM cell further comprises: a fourth region and a fifth region of the first conductivity type separated by a second channel region positioned between the fourth and fifth regions; and a sixth region of the second conductivity type which is adjacent to the second channel region; a third island of semiconductor material on the insulating substrate wherein the third island of semiconductor material further comprises a seventh region, an eighth region and a ninth region of the first conductivity type wherein the seventh and eighth regions are separated by a third channel region positioned between the seventh and eighth regions and the eighth and ninth regions are separated by a fourth channel region positioned between the eighth and ninth regions; a fourth island of semiconductor material on the insulating substrate wherein the fourth island of semiconductor material further comprises a tenth region, an eleventh region and a twelfth region of the second conductivity type wherein the tenth and eleventh regions are separated by a fifth channel region positioned between the tenth and eleventh regions and the eleventh and twelfth regions are separated by a sixth channel region positioned between the eleventh and twelfth regions, wherein a voltage $V_{ss}$ is applied to the seventh region of first conductivity type, a voltage $V_{dd}$ is applied to the tenth region of second conductivity type, and the ninth region of the first conductivity type and the eleventh region of the second conductivity type are interconnected as an output for a NAND logic function; a first floating gate common to the first, third and fifth channel regions; and a second floating gate common to the second, fourth and sixth channel regions. The device may further include at least one injector, the injector comprising a region wherein either one or both of the first common floating gate or the second common floating gate penetrates into the first or second channel region, respectively. In some configurations, the semiconductor material further comprises silicon. In some configurations, the insulating substrate further comprises sapphire. In some configurations, the insulating substrate further comprises a layer of silicon dioxide.

In a sixth aspect, the present invention is a semiconductor device comprising: an island of semiconductor material on an insulating substrate wherein the island of semiconductor material further comprises: a first region and a second region of a first conductivity type separated by a channel region positioned between the first and second regions; and a third region of a second conductivity type which is adjacent to the channel region; and a floating gate positioned over the channel region. The device may further include an injector, the injector comprising a region wherein the floating gate penetrates into the channel region. In some configurations, the semiconductor material further comprises silicon. In some configurations, the insulating substrate further comprises sapphire. In some configurations, the insulating substrate further comprises silicon dioxide.

In a seventh aspect, the present invention is a semiconductor programmable interconnect device, the device comprising: an EEPROM cell formed on an island of semiconductor material on an insulating substrate wherein the EEPROM cell further comprises: a first region and a second region of a first conductivity type separated by a first channel region positioned between the first and second regions; a third region and a fourth region of a second conductivity type separated by a second channel region positioned between the third and fourth regions; and a floating gate common to the first and second channel regions; a first interconnect in electrical contact with the first region of the first conductivity type; and a second interconnect in electrical contact with the second region of the first conductivity type. The device may further include a third interconnect in electrical contact with the third region of the second conductivity type; and a fourth interconnect in electrical contact with the fourth region of the fourth conductivity type. The device may further include an injector, the injector comprising a region wherein the common floating gate penetrates into at least one of the first or second channel regions. In some configurations, the semiconductor material further comprises silicon. In some configurations, the insulating substrate further comprises sapphire. In some configurations, the insulating substrate further comprises a layer of silicon dioxide.

In an eighth aspect, the present invention is a semiconductor content addressable memory cell (CAM) device comprising: a first EEPROM cell formed on a first island of semiconductor material on an insulating substrate wherein the first EEPROM cell further comprises: a first EEPROM cell N-channel device which includes a first N+ region and a second N+ region separated by a first channel region positioned between the first and second N+ regions; a first EEPROM cell P-channel device which includes a first P+ region and a second P+ region separated by a second channel region positioned between the first and second P+ regions; a second EEPROM cell formed on a second island of semiconductor material on the insulating substrate wherein the second EEPROM cell further comprises: a second EEPROM cell N-channel device which includes a third N+ region and a fourth N+ region separated by a third channel region positioned between the third and fourth N+ regions; a second EEPROM cell P-channel device which includes a third P+ region and a fourth P+ region separated by a fourth channel region positioned between the third and fourth P+ regions; a common floating gate positioned adjacent the first, second, third and fourth channel regions; a first interconnect in electrical contact with the first N+ region on the first EEPROM cell and the third P+ region on the second EEPROM cell; a first P-channel transistor having a first P-channel transistor source contact biased at a voltage $V_{DD}$, a first P-channel transistor drain contact connected to the first interconnect, and a clock signal connected to a first P-channel transistor gate contact; a second P-channel transistor having a second P-channel transistor source contact connected to the fourth P+ region on the second EEPROM cell, a second P-channel transistor drain contact, biased at $V_{SS}$ and a first input connected to a second P-channel transistor gate contact; and a first N-channel transistor having a first N-channel transistor drain contact connected to the second N+ region on the first EEPROM cell, a first N-channel transistor source contact connected to the second P-channel transistor drain contact and biased at a voltage $V_{SS}$, and a second input connected to a first N-channel transistor gate contact. The device may further include an injector, the injector comprising a region wherein the common floating gate penetrates into one or more of the first, second, third or fourth channel regions. In some configurations, the semiconductor material further comprises silicon. In some configurations, the insulating substrate further comprises sapphire. In some configurations, the insulating substrate further comprises a layer of silicon dioxide.

In a ninth aspect, the present invention is a semiconductor device comprising a first island of semiconductor material on an insulating substrate wherein the first island of semiconductor material further comprises: a first region and a second region of a first conductivity type separated by a first channel region positioned between the first and second regions; and a third region and a fourth region of a second conductivity type separated by a second channel region positioned between the third and fourth regions. The device may further include a floating gate positioned over at least a portion of each of the first and second channel regions. In some configurations, a portion of each of the first and second channel regions coincide. The device may further include an inverter configured as a latching sense amplifier, the inverter comprising: a second island of semiconductor material on the insulating substrate wherein the second island of semiconductor material further comprises a fifth region and a sixth region of the first conductivity type separated by a third channel region positioned between the fifth and sixth regions; and a third island of semiconductor material on the insulating substrate wherein the third island of semiconductor material further comprises a seventh region and an eighth region of the second conductivity type separated by a fourth channel region positioned between the seventh region and eighth regions, wherein a voltage $V_{ss}$ is applied to the fifth region of first conductivity type, a voltage $V_{dd}$ is applied to the seventh region of second conductivity type, and the sixth region of first conductivity type and the eighth region of second conductivity type are interconnected as an output for the latching sense amplifier; wherein the floating gate is positioned over at least a portion of each of the first, second, third and fourth channel regions. The device may further include an injector, the injector comprising a region wherein the floating gate penetrates into one or more of the first or second channel regions. In some configurations, the semiconductor material further comprises silicon. In some configurations, the insulating substrate further comprises sapphire. In some configurations, the insulating substrate further comprises silicon dioxide.

In a tenth aspect, the present invention is a semiconductor device comprising: an island of semiconductor material on an insulating substrate; a first electronic device of a first conductivity type fabricated in the island of semiconductor material, the first electronic device comprising: a first device source region; a first device drain region; and a first device channel region positioned between the first device source region and the first device drain region; and a second electronic device of a second conductivity type fabricated in the island of semiconductor material, the second electronic device comprising: a second device source region; a second device drain region; and a second device channel region positioned between the second device source region and the second device drain region. The device may further include a floating gate positioned over at least a portion of each of the first device channel region and the second device channel region. In some configurations, a portion of each of the first device channel region and the second device channel region coincide. The device may further include an injector, the injector comprising a region wherein the floating gate penetrates into one or more of the first device channel region or the second device channel region. In some configurations, the semiconductor material further comprises silicon. In some configurations, the insulating substrate further comprises sapphire. In some configurations, the insulating substrate further comprises silicon dioxide.

In an eleventh aspect, the present invention is a method for fabricating a semiconductor device which comprises providing a first island of semiconductor material on an insulating substrate wherein the first island of semiconductor material further comprises: a first region and a second region of a first conductivity type separated by a first channel region positioned between the first and second regions; and a third region and a fourth region of a second conductivity type separated by a second channel region positioned between the third and fourth regions. The method may further include providing a floating gate positioned over at least a portion of each of the first and second channel regions. The method may further include providing that a portion of each of the first and second channel regions coincide. The method may further include providing an injector, the injector comprising a region wherein the floating gate penetrates into one or more of the first or second channel regions. In some applications, the method further includes providing that the semiconductor material further comprises silicon. In some applications, the method further includes providing that the insulating substrate further comprises sapphire. In some applications, the method further includes providing that the insulating substrate further comprises silicon dioxide.

In a twelfth aspect, the present invention is a semiconductor device comprising: a layer of semiconductor material on an insulating substrate; a first electronic device of a first conductivity type fabricated in the layer of semiconductor material, the first electronic device comprising a first region and a second region of the first conductivity type separated by a first channel region positioned between the first and second regions; a second electronic device of a second conductivity type fabricated in the layer of semiconductor material, the second electronic device comprising a third region and a fourth region of the second conductivity type separated by a second channel region positioned between the third and fourth regions; and a common floating gate positioned over at least a portion of each of the first and second channel regions. The device may further include an injector, the injector comprising a region wherein the common floating gate penetrates into at least one of the first or second channel regions. In some configurations, the semiconductor material further comprises silicon. In some configurations, the insulating substrate further comprises sapphire. In some configurations, the insulating substrate further comprises silicon dioxide. In some configurations, the first electronic device of the first conductivity type is fabricated in a first island of semiconductor material on the insulating substrate and the second electronic device of the second conductivity type is fabricated in a second island of semiconductor material on the insulating substrate. In some configurations, the first electronic device of the first conductivity type and the second electronic device of the second conductivity type are fabricated in a single island of semiconductor material on the insulating substrate.

In a thirteenth aspect, the present invention is a method for fabricating a semiconductor device which comprises: providing a layer of semiconductor material on an insulating substrate; fabricating in the layer of semiconductor material a first electronic device of a first conductivity type, the first electronic device comprising a first region and a second region of the first conductivity type separated by a first channel region positioned between the first and second regions; fabricating in the layer of semiconductor material a second electronic device of a second conductivity type, the second electronic device comprising a third region and a fourth region of the second conductivity type separated by a second channel region positioned between the third and fourth regions; and a common floating gate positioned over at least a portion of each of the first and second channel regions. The method may further include providing an injector, the injector comprising a region wherein the common floating gate penetrates into at least one of the first or second channel regions. The method may further include providing that the semiconductor material further comprises silicon. The method may further include providing that the insulating substrate further comprises sapphire. The method may further include providing that the insulating substrate further comprises silicon dioxide. The method may further include fabricating the first electronic device of the first conductivity type in a first island of semiconductor material on the insulating substrate and fabricating the second electronic device of the second conductivity type in a second island of semiconductor material on the insulating substrate. The method may further include fabricating the first electronic device of the first conductivity type and the second electronic device of the second conductivity type in a single island of semiconductor material on the insulating substrate.

These and other characteristics of the present invention will become apparent through reference to the following detailed description of the preferred embodiments and accompanying drawings.

BRIEF DESCRIPTION OF THE DRAWINGS

FIG. 7. EEPROM cell with increased aspect ratio for N-channel device.

FIG. 8. EEPROM cell with multiple Si islands for a single floating gate.

FIG. 12. EEPROM cell used as a storage node and pass gate for a programmable interconnect.

FIG. 13. Use of two EEPROM cells to provide a content addressable memory cell.

DETAILED DESCRIPTION OF THE PREFERRED EMBODIMENTS

Physical Description

Figure 1:
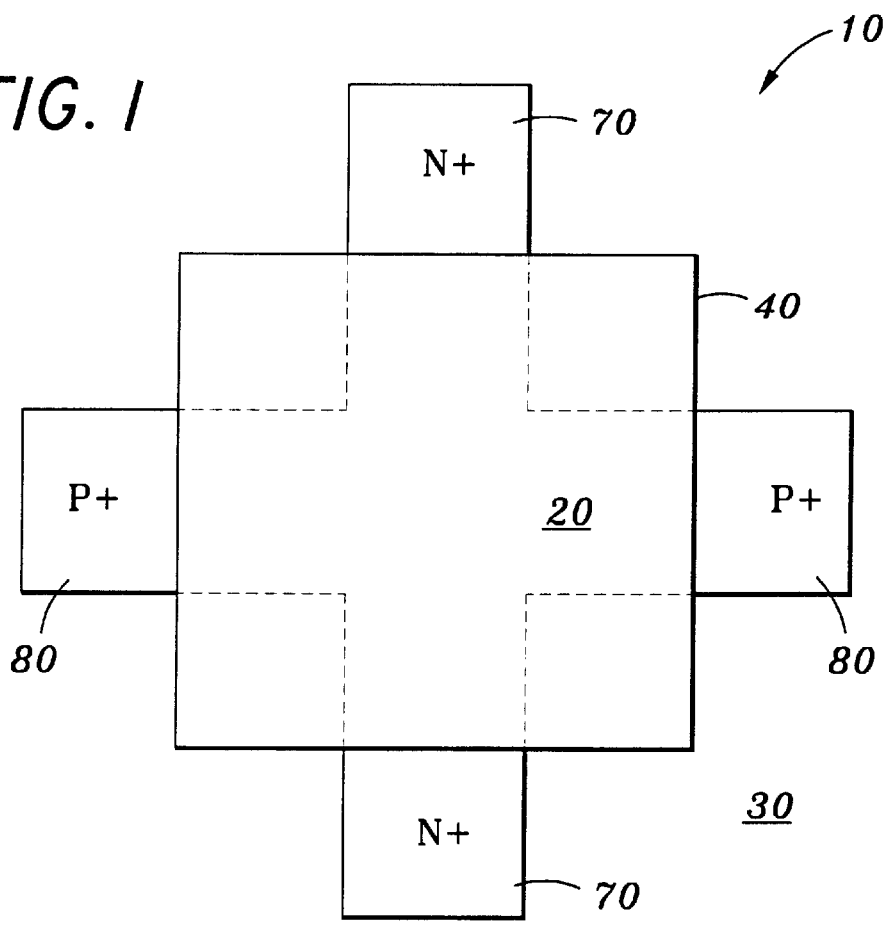
FIG. 1. Top view of basic EEPROM storage cell, shown without metalization.
Figure 2:
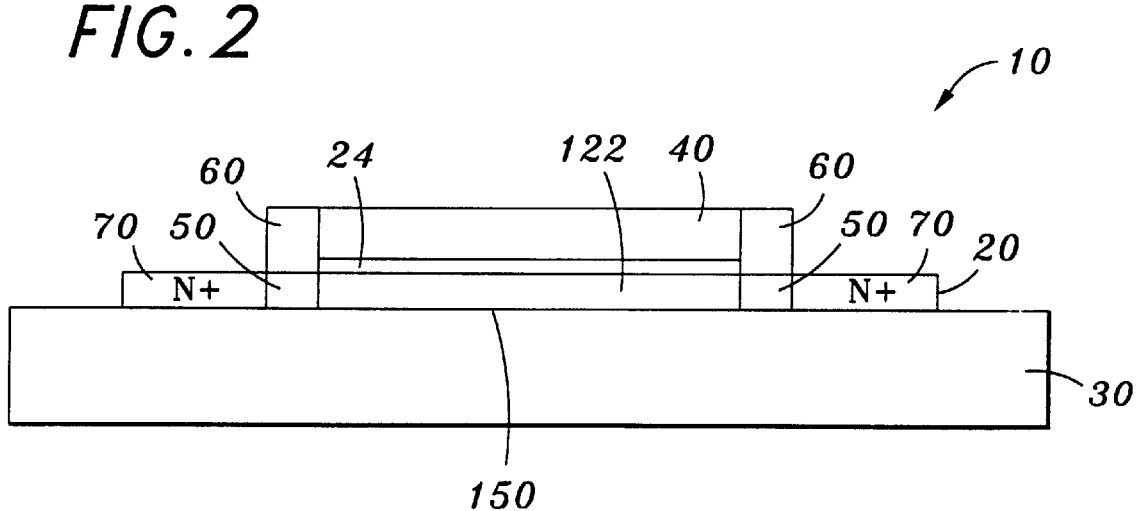
FIG. 2. Cross-section view of basic storage cell shown without metalization.

FIG. 1 shows a top view of the current invention 10. As shown in FIGS. 1 and 2, embodiment 10 comprises a single island of silicon 20 on an insulating substrate 30, for example sapphire or silicon dioxide. In all steps and layers defined below, the processing occurs during the standard CMOS process step, i.e., there are no steps or layers added to the standard CMOS flow. The silicon island 20 can be defined by either LOCal Oxidation of Silicon (LOCOS) or mesa isolation techniques. The aspect ratios and shape may be different than the detailed one shown, but a symmetric one is shown here for convenience of discussion.

The island 20 may then receive a threshold adjust implant or it can remain intrinsic (i.e., no implant), as assumed in this discussion. Then a gate oxide 24 is grown and polysilicon is patterned as a floating gate 40. Either N+ or P+ polysilicon can be used and it can be silicided or not. In this case, it is assumed to be N+ polysilicon. Following polysilicon gate patterning, Lightly Doped Drain (LDD) implants 50 and sidewall spacers 60 are formed followed by N+ and P+ regions 70, 80, as shown. The device is contacted by aluminum metalization (not shown) at the N+ and P+ regions 70, 80. Obviously, no contact is made to the floating gate 40. A top view of the basic storage cell 10 is shown in FIG. 1.

FIG. 2 shows a cross sectional view of the storage cell 10, cutting through the N-channel device 70. The P-channel device 80 is the same, except the N+ region 70 would be P+. Throughout this description, the N-channel device 70 will be described with the understanding that the P-channel 80 is essentially the same unless differences are described. The device described in FIG. 1 and FIG. 2 is the basic storage cell 10. Charge is injected onto the floating gate 40 where it is stored until charge of the opposite polarity is injected. Once on the floating gate 40, the charge remains permanently since the floating gate 40 is encased in silicon dioxide. It can also be seen from FIG. 1 and FIG. 2 that the device 10 is manufactured with a standard, unmodified CMOS process. It can also be seen that the structure 10 can only be made in SOI material due to the folded nature of the N-channel and P-channel devices 70, 80. As will be seen, the device 10 is further enhanced if the MOS transistors 70, 80 are fully depleted. If this structure 10 were manufactured in bulk Si, the substrate 30 would have to be either P-type or N-type to provide junction isolation for either the N+ or P+ Source/Drain (S/D) regions 70, 80, respectively. However, while providing junction isolation for one of the transistors 70, 80, the same polarity would short the other S/D region 70, 80 through the substrate 30. It is the insulating substrate nature of the SOI substrate 30 which enables this structure 10 to provide both N- and P- channel devices 70, 80.

Figure 3:
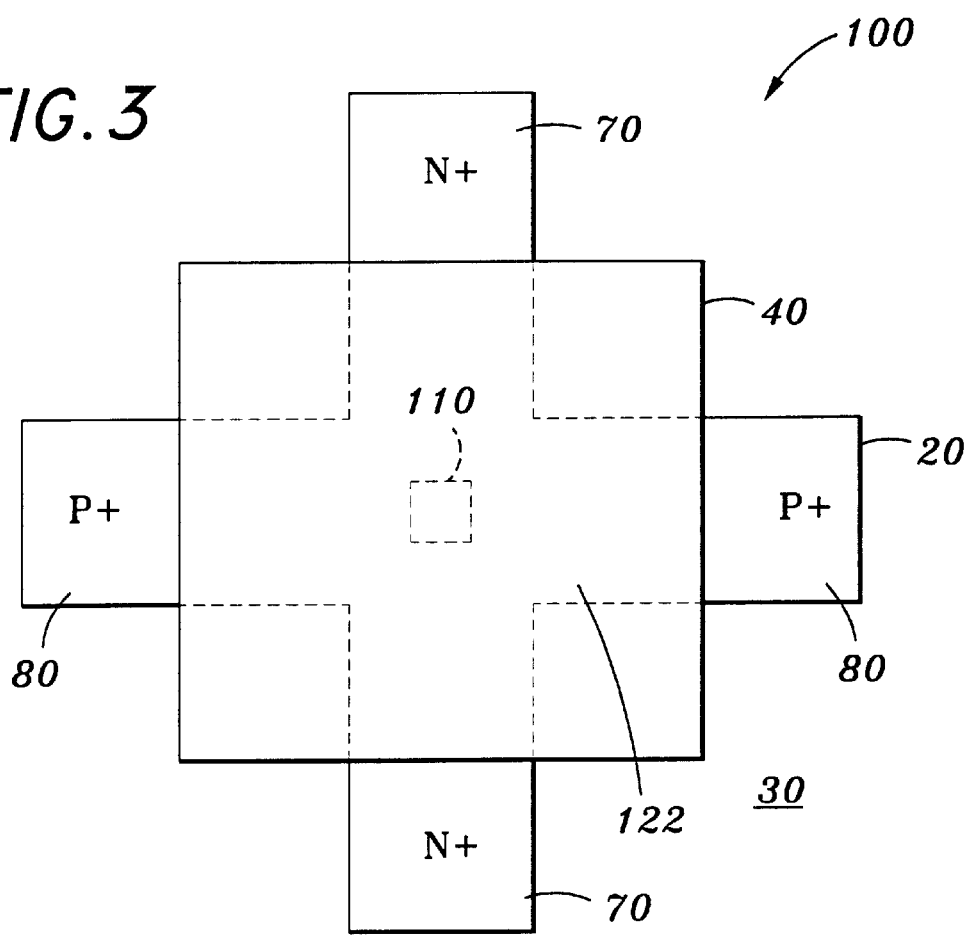
FIG. 3. Top view of storage cell including centered CHE injector hole.
Figure 4:
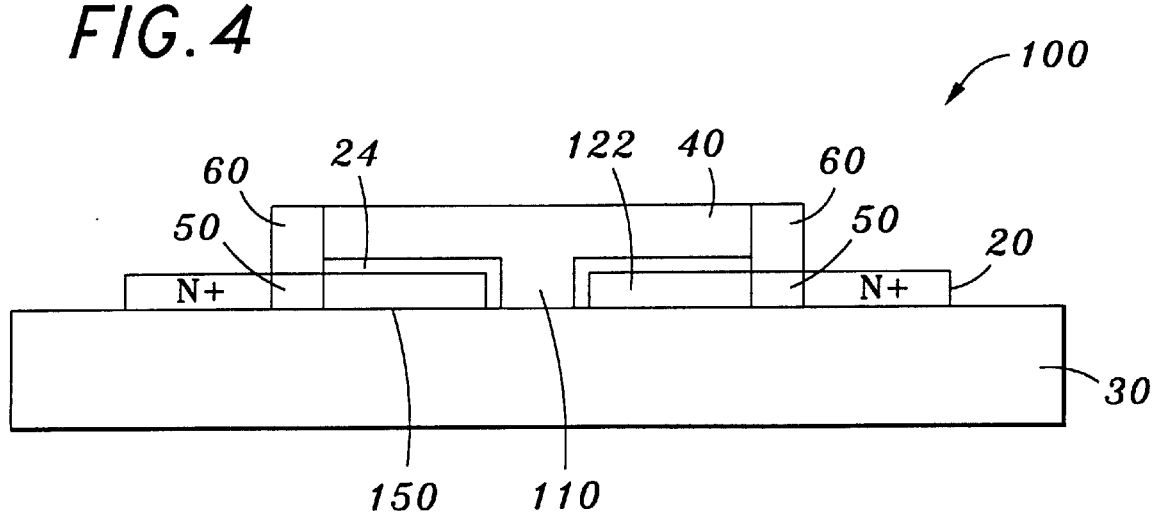
FIG. 4. Cross sectional view (through center and along N-channel) of storage cell with centered CHE injector.

FIG. 3 and FIG. 4 show top and side views of an alternate structure 100 which differs from that shown in FIG. 1 and FIG. 2 by the addition of an injector region 110 in the channel 122 of the storage cell 100. The injector 110 is a hole in the channel 122 formed during the island 20 formation stage. If the CMOS process is mesa isolated process, the injector 110 inherently penetrates to the insulating layer 30. If the process is LOCOS isolated, the injector 110 can be designed to penetrate to the insulating layer 30 or partially through the silicon channel 122. In FIG. 4 the injector 110 is shown penetrating to the insulating layer 30.

Operation

There are two different mechanisms of operation: avalanche injection and channel hot electron (CHE) tunneling. Devices with and without the injector 110 can operate under avalanche injection while the injector 110 is necessary to enhance CHE injection. Avalanche injection will be described first.

Avalanche Injection

Figure 5:
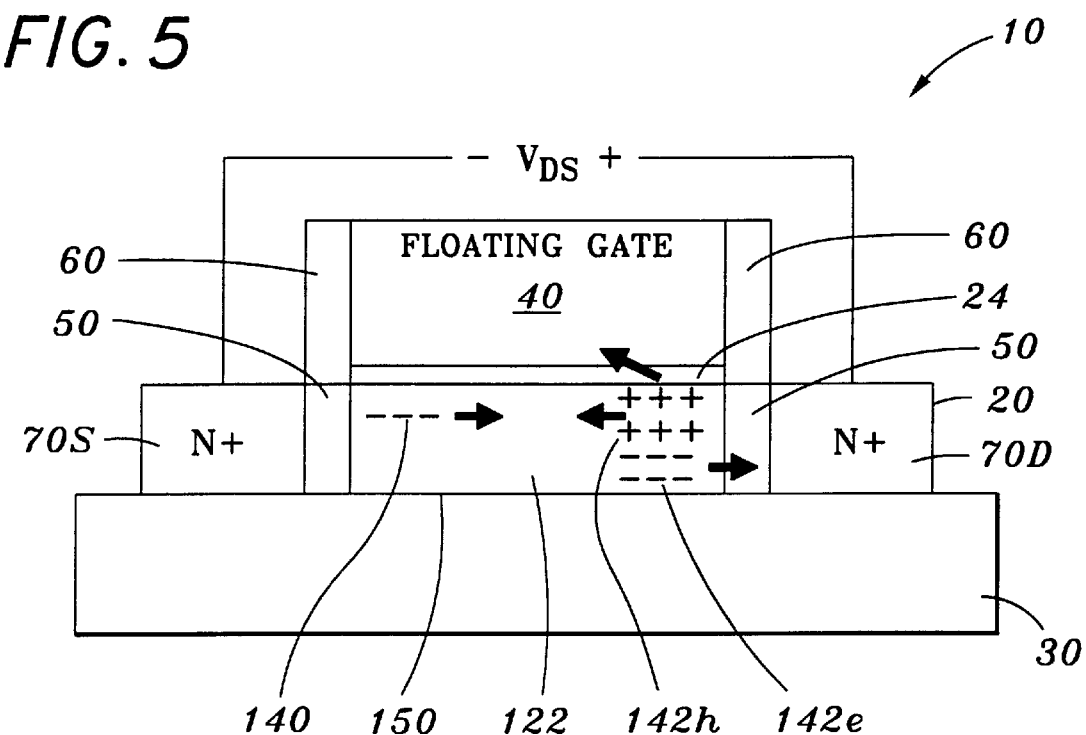
FIG. 5. Cross sectional view of avalanche injection mechanism for N-channel device; the applied voltage $V_{DS}$ must exceed the avalanche voltage of the drain.

FIG. 5 depicts the avalanche injection mechanism for the N-channel device 70. The P-channel device 80 operates the same way, except polarities of voltages, currents and charge carriers are all reversed. For the N-channel device 70, a voltage $V_{DS}$ is applied between the two N+ regions 70S, 70D. Since the device 10 is completely floating, the only issue is the magnitude of the voltage drop between these regions 70S, 70D, not their absolute value with respect to the nearest ground. By definition, the most positive terminal will function as the drain 70D, (for the P-channel 80, the most negative terminal would function as the drain) so the applied voltage will be called $V_{DS}$ The voltage on the gate 40 with respect to the most negative terminal will be called $V_{GS}$.

FIG. 5 shows the behavior of the device 10 when $V_{DS} > V_{AV}$, where $V_{AV}$ is defined as the voltage at which avalanche multiplication starts to occur at the drain 70D. Under these conditions, electron-based leakage current 140 transfers from the source 70S to the drain 70D where they encounter the high electric field which induces avalanche multiplication. Avalanche multiplication is the quantum mechanical mechanism in which a high energy carrier (either electron or hole) interacts with a material (in this case the silicon) imparting enough energy to create a hole-electron pair 142h, 142e. The result is that the original particle 140 has now been multiplied to three: in this case one electron 140 is now two electrons and a hole 140, 142e, 142h. The two electrons 140, 142e may undergo the process many times, thereby increasing the current by orders of magnitude, hence the name. The mechanism is triggered by a critical electric field and is characterized by an almost instantaneously sharp increase in device current. It is also characterized in a MOSFET by a transition from conduction by a single carrier type (electrons in N-channel devices, holes in P-channel devices) to conduction by both carrier-types (holes and electrons in both types of devices). Finally, the generated hole-electron pair 142h, 142e is often created with excess energy, thereby creating so called "hot" electrons and holes. When these characteristics are combined with a strong electric field from the drain 70D toward the floating gate 40, so-called hot carrier (hot holes in this case) injection occurs.

The polarity of hot carrier injection is such that the N-channel device 70 injects avalanche generated holes 142h onto the floating gate 40 which in turn charge the gate 40 positively with respect to its previous charge state of the N-channel device 70. When the applied $V_{DS}$ is removed, the gate 40 remains positively charged with respect to the entire N-channel device 70 since the channel is then at a uniform potential. With a stored positive charge on the gate 40, the N-channel device 70 is "on" and the P-channel device 80 is "off". Hence, the EEPROM cell 10 is now programmed to a "positive" ("+") state, arbitrarily defined herein as a "one" or "high".

The mechanism is the same for the P-channel device 80 wherein a voltage is applied to $V_{DS}$ sufficient to induce avalanche multiplication at the most negative terminal (but again not necessarily negative with respect to the nearest ground). In this case, normal holes create avalanche induced hole-electron pairs, the holes of which continue the avalanche mechanism. The hot electrons are accelerated by the now reversed electric field and are injected into the floating gate 40, thereby charging the gate 40 negatively with respect to the silicon. With a stored negative charge on the gate 40, the P-channel device 80 is "on" and the N-channel device 70 is "off". Hence, the EEPROM cell 10 is now programmed to a "negative" ("−") state, arbitrarily defined herein as a "zero" or "low".

Reading the state of the device 70, 80 is accomplished by applying a voltage to either the N-channel or P-channel MOSFET 70, 80. However, reading is affected by whether the device 70, 80 is fully depleted or partially depleted. In the fully depleted case, when one transistor 70 or 80 is "on", the other transistor 80 or 70, respectively, is inherently "off", a combination which is very valuable for numerous applications. For a partially depleted device, a conduction channel of one polarity exists under the depletion (and inversion) region near the silicon-insulator interface 150. This means both transistors 70, 80 would be "on" but with different drive strengths. The advantages of the fully depleted condition are sufficient that for the remainder of this document such a state will be assumed. However, it is recognized that fully depleted operation is an enhancement but it is not necessary to the basic EEPROM operation. There may even be applications or conditions wherein the partially depleted condition is preferable.

If a voltage is applied between the N+ or P+ terminals 70, 80, a current would be measured to read the device 70, 80. If a voltage is applied to one N+ or P+ terminal 70, 80, a voltage could be measured at the other N+ or P+ terminal 70, 80, respectively. For example if the gate 40 is stored positively, the N-channel 70 is "on" and the P-channel 80 is "off". A voltage applied to the NMOSFET 70 would result in high current (typically many microamps) while a voltage applied to the PMOSFET 80 would result in low current (typically picoamps). Either one can serve as the reading signal. If a voltage is applied to one N+ region 70, the voltage would be measured at the other N+ region 70 since the channel is in the n-type conduction state (i.e., it is accumulated with electrons). If a voltage is applied to one P+ region 80, the voltage would not be measured at the other P+ region 80 since the channel is in the n-type conduction state (i.e., it is accumulated with electrons) which holds the PMOS device 80 "off". The mechanism would be the same with reversed polarities if the device were programmed to a "−" state, i.e., voltage or current would pass through the PMOS device 80 and the NMOS device 70 would block such signals. Hence reading can be accomplished through either N or P type conduction and for either "+" or "−" stored charge.

There are obviously many variations on the details described above.

For example, the voltage was applied to the N or P MOS devices 70, 80.

However, the avalanche mechanism could also have been triggered by a reverse bias applied to any of the diodes present in the structure (in this case a positive voltage would be applied to either N+ region 70 with respect to either of the P+ regions 80. Also, the aspect ratio of the device 10, 100 could be altered; the shape could be different; doping concentrations in the channel 122, LDD 50, N+ and P+ regions 70, 80 could be changed; the shape of the silicon island 20 with respect to the floating gate 40 could be changed and virtually every aspect of the device 10, 100 could be modified to affect performance on writing voltage, speed, power consumption, charge storage, etc. in accordance with standard design practice. The purpose of this document is only to define the basic mechanisms without implying any restrictions on various options.

With both mechanisms available to the same floating gate 40, the device 10, 100 can be electrically programmed to both a "high" and a "low" state. This is a capability which was not available to original avalanche induced EPROM devices which in turn required UV erasure. It was the same limitation which forced a dual gate solution to be sought to provide EEPROM, thereby adding the disadvantages discussed above. In the current device 10, 100, it can be seen that no additional processing steps are required to provide full EEPROM capability.

Channel Hot Carrier (CHC) Injection

Figure 6:
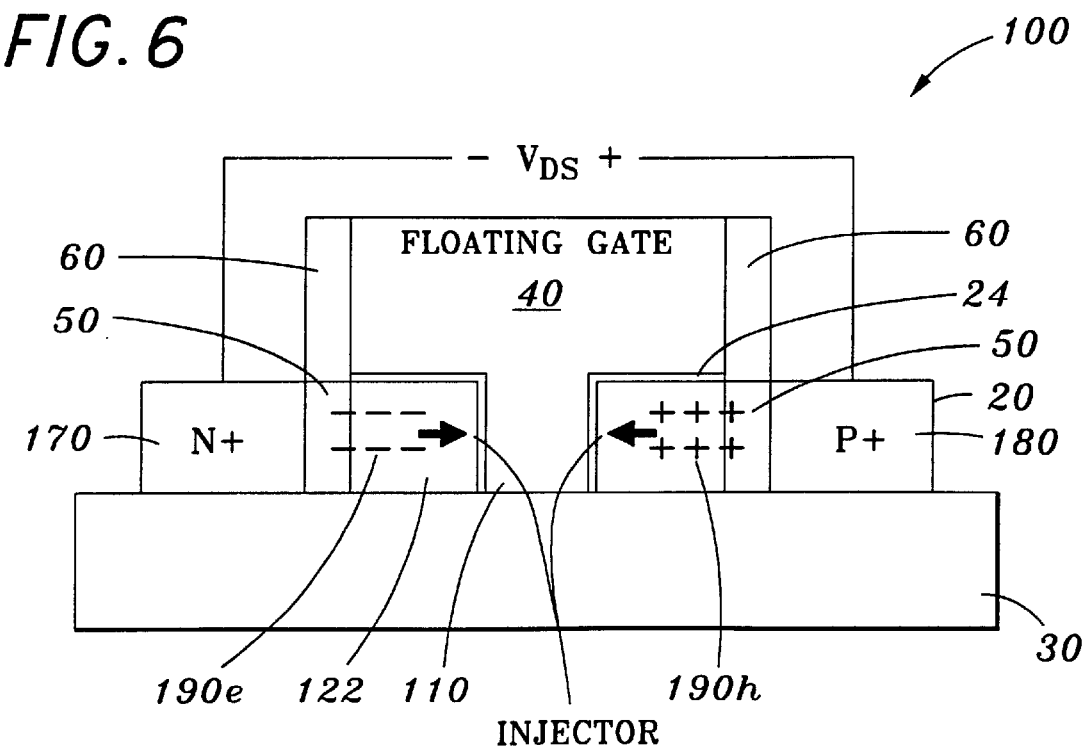
FIG. 6. CHE injection mechanism as shown by a cross section through an N+ region and a P+ region.

FIG. 6 shows an alternative mechanism for writing both polarity charges onto the floating gate 40. The mechanism is based on using the excess energy and momentum of carriers provided by either a forward biased diode 170, 180 or a conducting MOS transistor. FIG. 6 shows the case of a forward biased diode 170, 180 since both an N+ 170 and a P+ 180 region are shown. If both doped regions 170, 180 were the same polarity, the devices would be MOSFETs instead of diodes, and the current flow would be only of the same polarity as the S/D doped regions.

When the diode 170, 180 is forward biased, electrons 190*e* are injected by the N+ region 170 and holes 190*h* are injected from the P+ region 180. They recombine with each other as they traverse the length of the device. Remembering that the injector 110 is in the center of the device 170, 180, most of the diode current passes around the injector 110. However, for current which encounters the injector 110, some of the charge will have sufficient energy and momentum to penetrate the gate oxide 24 onto the floating gate 40, thereby charging the floating gate 40.

Since both holes 190*h* and electrons 190*e* are involved in diode current, both may be injected onto the floating gate 40. Hence the physical location of the injector 110 with respect to the diode junctions along with the relative concentrations of holes 190*h* and electrons 190*e* at the injector 110 will determine which polarity carrier will be injected in the majority which in turn determines the polarity of net charge on the floating gate 40. (For MOSFET injection, this issue does not exist since its conduction is unipolar, i.e., majority carriers only).

The CHC injection mechanism offers several advantages. This mechanism operates at very low voltages, in theory requiring only 0.7 V to start the injection process in the case of diode injection, and even less for MOSFET injection. Writing efficiency and speed will determine the actual voltages used, since higher voltage will increase the current and associated injection current. Operation at such low voltages eliminates the need for any charge pumps and also increases reliability of the device 100. It also solves a long-term problem of providing EEPROM for space applications which can be destroyed if during a high voltage writing step a high energy particle penetrates the cell. Under these circumstances a traditional EEPROM cell can be physically destroyed, an issue which has limited the use of EEPROM in satellites and other radiation sensitive applications.

The injection current also occurs in proportion to the silicon device current (diode or MOSFET), so the amount of charge on the gate 40 can be controlled by controlling the device current. This will enable both control of overwriting and it also enables an analog memory capability in addition to the digital EEPROM discussed above.

Also, in the case of diode injection, both polarity carriers are available, so multiple design options can be considered for the cell 100 based on injector 110 locations (there can be multiple injectors 110), dopant concentrations in the LDD 50 and channel regions 122 and size and location of the floating gate 40 with respect to the silicon channel 122.

How the charge was injected does not affect how the cell's state is read. Hence, reading the cell 100 is the same as discussed above for the avalanche injection. A difference is if the device current is measured, presence of the injector 110 reduces the amount of current resulting from a given applied voltage.

Alternatives

Structural Variations

The top views shown in FIG. 1 and FIG. 3 can be modified in virtually all dimensions as well as in the number of contact points. For example, either the N- or P-channel device 70, 80 could be longer or wider 20 to enhance read or write strength (see embodiment 10A in FIG. 7). Additionally, the silicon island 20 could be separated into multiple sections 20a, 20b, 20c to provide multiple read or write points for a single cell 10B or multiple strength read or write signals (see embodiment 10B in FIG. 8). Also, the device could be designed to have multiple contact regions (see embodiment 10C in FIG. 9). The channel regions 122 could also have non-uniform dopant concentrations. For example the channel region 122 adjacent the LDD 50 for either polarity transistor could have different amount and type of dopant to enhance either read or write performance. Some of these ideas are demonstrated in FIG. 7, FIG. 8, and FIG. 9.

Figure 10:
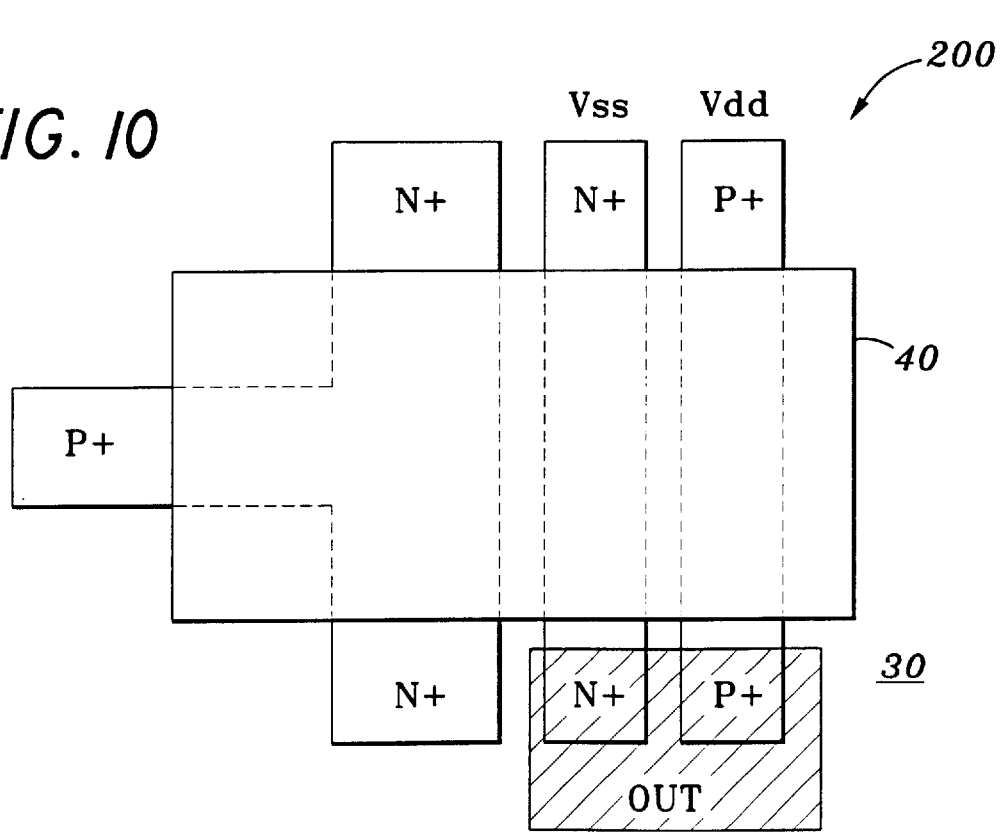
FIG. 10. EEPROM cell with integrated inverter serving as a latching sense amp.

More complex and integrated structures can also be designed. FIG. 10 shows a storage cell with an integrated inverter 200 driven by the floating gate 40. This structure functions as a memory cell with integrated sense amp and latch. If the floating gate 40 is charged positively the N-channel device is "on", the P-channel is "off" and the output will be "low" (inverter function). If the floating gate 40 is charged negatively the N-channel is "off", the P-channel is "on" and the output will be "high" (the other inverter state). This therefore represents a memory cell with an integrated sense amp and data latch. Hence the read mechanism will be simple, fast and can be included in any location in an integrated circuit.

Figure 11:
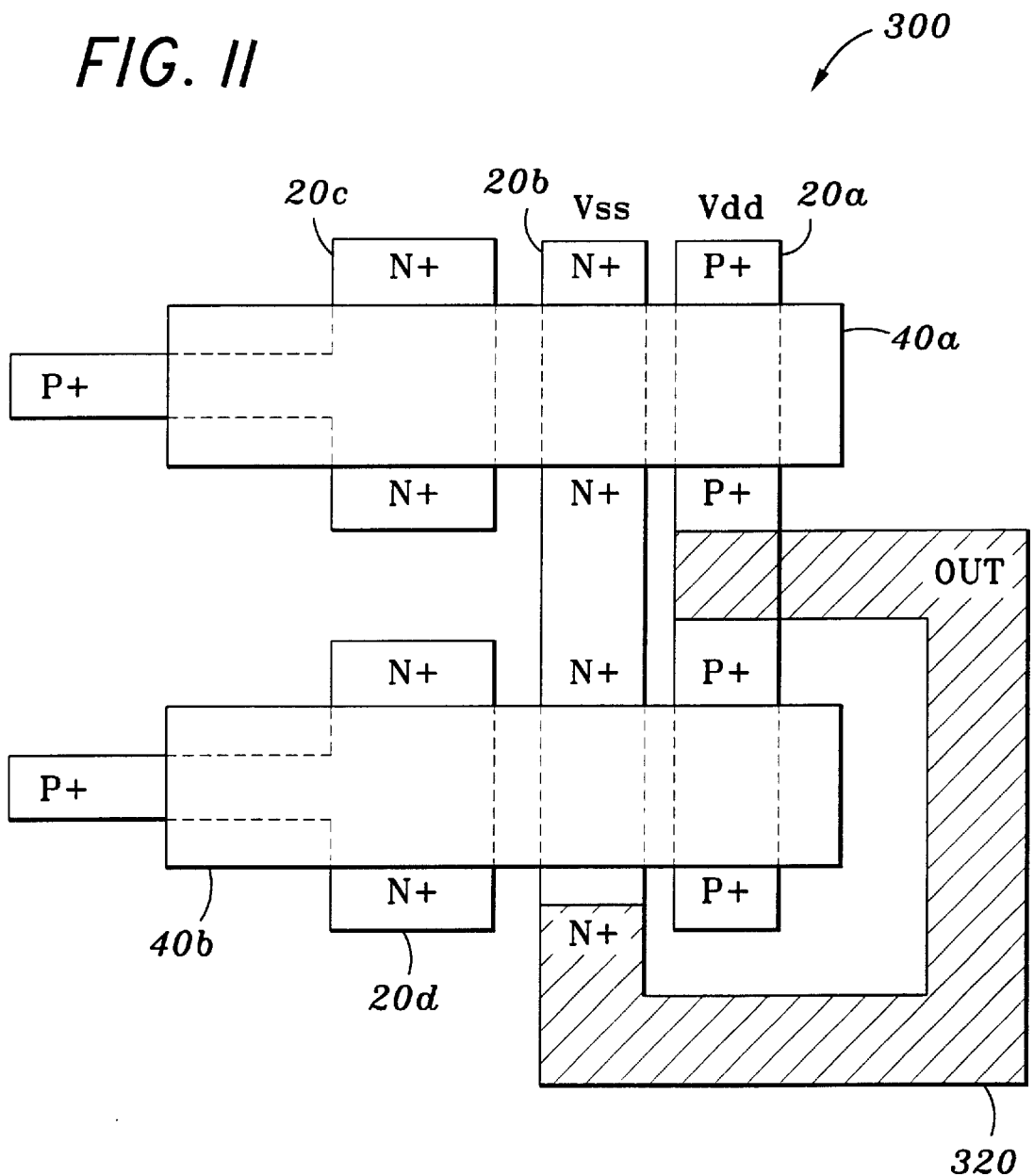
FIG. 11. EEPROM cell with integrated NAND gate with the cross-hatched areas representing interconnects for the NAND logic function.

Additional logic functions can also be designed. By providing two floating gates 40a, 40b over multiple islands 20a, 20b, 20c, 20d, complex logic can be driven by the stored charge on the gates 40a, 40b. An example is shown in FIG. 11 wherein a two-section floating gate 40a, 40b provides the input to a 2 input NAND gate 300. In FIG. 11, the cross hatched area represents interconnects 320 for the NAND logic function. Functioning is similar to the inverter 200 described above, except the logic function is the more complex 2 input NAND. Obviously very complex logic can be included with the EEPROM cell.

These variations as shown above are on structures without injectors 110. Obviously it is possible to consider combinations of both, i.e., regions without injectors 110 written with avalanche injection and regions with injectors 110 written with CHC injection. Such structures could combine digital and analog memory, fast and slow write options and many other uses. It is also possible to consider variations of the number, location, and size of the injectors 110. Since N+ regions inject electrons and P+ regions inject holes, injector spacing and design will affect carrier injection performance. A hole near a P+ region will receive increased hole injection while one near an N+ region will receive increased electron injection.

Also, the size and depth of the injector 110 will also affect injector and cell performance. Larger full-depth injectors will increase carrier injection but decrease read current. Injectors which penetrate only partially through the silicon film 20 could see reduced carrier injection but increase read current.

Clearly there are many more implementations of the cell 10, 100, 200, 300 which can be considered and utilized for multiple applications. The purpose of these figures is to select only a few without creating any limitation on other designs which could impact other applications.

Operational Variations

There are also other methods of writing or reading the cells 10, 100, 200, 300. For example, since the gate material is the same for both the NMOS device 70 and the PMOS device 80, the difference in threshold voltages of these two devices will be approximately equal to the band gap of silicon, or approximately 1 V. Therefore the device can be programmed to a third unique state by storing a voltage between the two threshold voltages. Under such conditions, both the NMOS 70 and PMOS 80 device will be "off", which is different from the previously discussed states of one transistor always "on". This operation would be a tri-state (or trinary) memory cell which has many potential uses. The most obvious is that the effective memory density would be increased by 50% (3 pieces of information per cell versus 2). Multi-state logic has received much attention in the literature, and this cell could find use in such architectures.

There is an additional feature of this device which needs to be discussed. When the cell 10, 100, 200, 300 is manufactured, the floating gate 40 may have little or no charge on it. However, after programming, the channel region 122 is accumulated with either holes or electrons. The polarity of the charge dictates where the metallurgical junctions are located. That is, if the channel 122 is accumulated with holes they form a diode junction at the N+ regions 70 (and there is no junction at the P+ region 80). Conversely, if the channel 122 is accumulated with electrons they form a diode junction at the P+ regions 80 (and there is no junction at the N+ region 70). This affects design of the injector 110 for ballistic injection since the junction location is determined by the charge state of the floating gate 40. For example if the floating gate 40 is positively charged, the channel 122 is accumulated with electrons and an injector near an N+ region 70 would not be at the metallurgical junction. For a negatively charged floating gate 40, such an injector 110 would be at the metallurgical junction. Since the injector efficiency is affected by the surrounding charge type and electric field this effect must be included in cell 10, 100, 200, 300 design.

Avalanche injection is not affected by the location of the metallurgical junction since it will be reverse biased regardless of its physical location. However, the breakdown characteristics of the junction are determined by the carrier concentration on both sides of the metallurgical junction. One side is set by the LDD 50 doping concentration while the other side is determined by the carrier concentration induced by the floating gate 40. There is an optimum carrier concentration for carrier injection. If the carrier concentration is low, the avalanche voltage will be relatively high. If the carrier concentration is too high, however, gate induced drain leakage (GIDL) can occur which can prevent avalanche breakdown. This would prevent avalanche carrier injection.

This effect can have a benefit by self-limiting avalanche injection. Avalanche injection increases carrier concentration until the GIDL effect swamps the avalanche effect as the dominant junction breakdown mechanism. Without avalanche multiplication, there are no hot carriers and charge injection onto the floating gate 40 ceases, thereby limiting the total amount of charge injected. By properly designing the cell 10, 100, 200, 300, this mechanism can ensure accurate writing levels and prevent over-writing.

Additional Applications

With the ability to include logic with EEPROM, multiple applications are possible. Two specific ones are described herein simply to show the flexibility, and not to imply any limitation on other applications.

The first such application, shown in FIG. 12, is to use the basic cell shown in FIG. 1 as a combined storage and connection node 400 for products such as field programmable gate arrays (FPGA). In such products, two wires are either connected or not connected according to a signal routing plan determined by the user. Often, an SRAM cell is used to store the information and a pass gate is used to allow bi-directional signal flow when a connection is programmed. The application 400 is shown in FIG. 12. Two interconnect wires 420a, 420b make contact to the NMOS portion 70 of the EEPROM cell. In this case the wires 420a, 420b are parallel but an orthogonal structure is simply a layout variation of FIG. 12.

Figure 9:
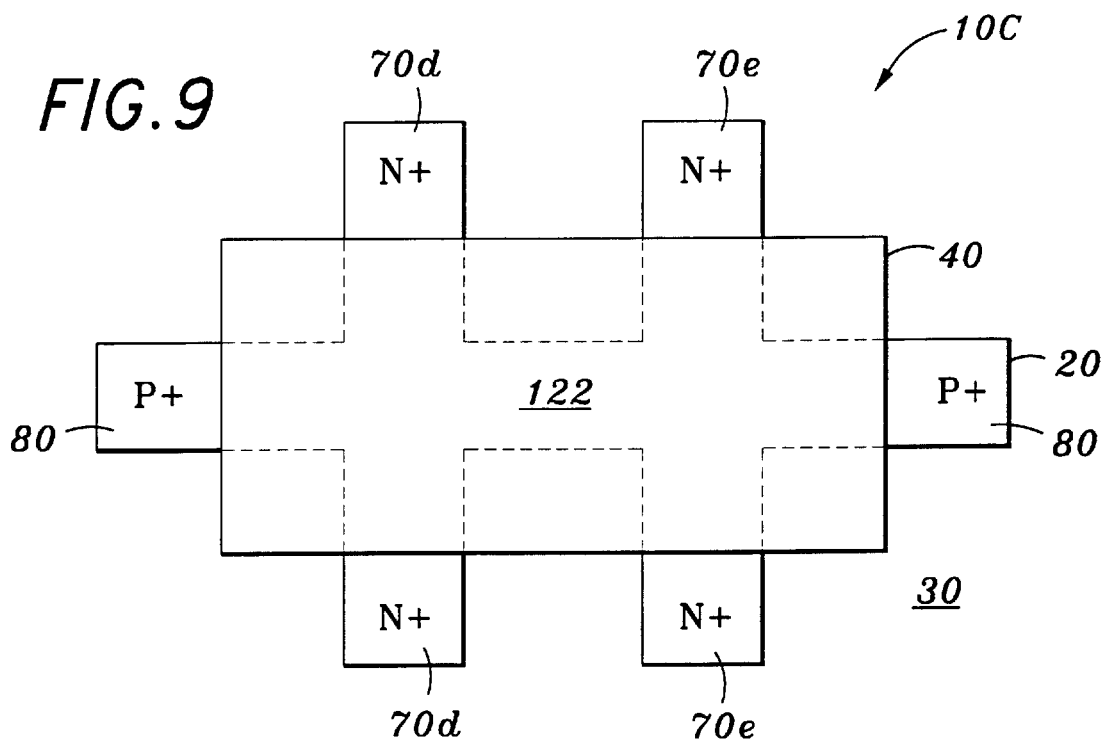
FIG. 9. EEPROM cell with multiple read or write ports.

Operation is quite simple. If the EEPROM cell is programmed with a positive charge, the NMOS device 70 is "on" and it makes a connection between the two wires 420a, 420b. Since the conducting channel 122 is on an insulating substrate 30, it serves as a bi-directional interconnect with equal rise and fall time performance. The speed, or current carrying capacity would be controlled by adjusting the aspect ratio as shown in FIG. 7 or increasing the number of contacts and current by using a cell 1OC as shown in FIG. 9. If the EEPROM cell is programmed with a negative charge, the NMOS device 70 is "off" thereby breaking the connection between the two wires 420a, 420b. Advantages of the concept are that one device serves two functions, the area is very small, increasing density and lowering cost, it adds no additional processing to the FPGA process and the programming is non-volatile.

Illustration of a second novel application is shown in FIG. 13: a content addressable memory, or CAM, 500. As in all illustrations in this document, this one shows only one embodiment, with many others possible.

The device 500 in FIG. 13 operates by comparing a stored state on the floating gate 40 against the state of A, shown as inputs to the two transistors 508a, 508b. It is pointed out that the right hand transistor 508b is a P-channel device. It is also necessary to note that while there are two separate Si islands 520a, 520b, the floating gates 540a, 540b are connected together to ensure they have the same polarity and amount of charge. It is also pointed out that the storage cells 510a, 510b are connected to the output node 550 at different polarities, i.e., the left hand 510a one is connected to an N+ node while the right hand one 510b is connected to a P+ node.

The logic operation is essentially that of a dynamic exclusive NOR. That is, the output is in one state if the EEPROM matches "A" while the output is in the opposite state if the EEPROM does not match "A". Referring to FIG. 13, the clock 554 signal pulls the output node "high" prior to arrival of the signal to be matched on A. When the signal arrives, if the EEPROM floating gate 540 is positive and A is "high" (positive), then the left EEPROM cell 510a is "on" and the N-channel transistor 508a is "on", pulling down the output node, indicating a match. Meanwhile the right hand EEPROM 510b is "off" (it is attached to the P+ node), so no current flows through that section. If the EEPROM were positive and A were "low", the left hand EEPROM 510a would still be "on", but the N-channel device 508a would be "off", keeping the output "high", indicating a mismatch. The right hand EEPROM 510b is still "off", so the output stays "high", indicating a mismatch.

Continuing the analysis, if the EEPROM floating gate 540 is charged negative, the left hand cell 510a is "off" and no current flows through that section, regardless of the value of A. However, the right hand EEPROM 510b is now "on" and if A is low since that will turn on the P-channel device 508b. This pulls down the output node, indicating a match. Finally if A is "high", it shuts off the P-channel transistor 508b, the output stays "high", indicating a mismatch.

The combination of these states is that the output is "low" if the EEPROM stored state matches the A state and the output is "high" if the EEPROM does not match A. It is pointed out that this structure could also be made using a contacted gate with a second input, B, in place of the floating gate 540 to make an XOR structure. While the structure would work in bulk Si, the body effect in the P-channel devices would cause asymmetric speed with respect to matching one's versus matching zero's. Also this effect causes a voltage drop equal to a threshold voltage, which also could cause errors or reduce noise margin. Hence the device will work very well in fully depleted SOI while it would work marginally or not at all in bulk Si.

This cell 500 could therefore clock data through and detect matches. If a number (say 8, i.e., a byte) of them were put in series, a byte-level match would be required to pull the output low. Or the outputs of many such cells could be deciphered by combinational logic (for example an 8-bit NAND or equivalent) to provide byte level content addressing.

Such capability is widely used for large data base systems and for packet-based communications systems. In the former, finding records based on their information content can be much more efficient than retrieving records by address then reading and interpreting the data in software. For the communications system application, data packets contain address information which determines the data's destination. If such data streams were compared in hardware to known addresses, the routing could be performed entirely in hardware which is both faster and cheaper than alternative methods.

Summary, Ramifications and Scope

Although the description above contains many specificities, these should not be construed as limiting the scope of the invention but as merely providing illustrations of some of the presently preferred embodiments of this invention. For example, there are many variables which can be used to optimize performance or power, speed, voltage, manufacturability, retention, and noise margin, radiation hardness, cell size and others. These variables include, size, shape, location and orientation of N+, P+, LDD's, islands, injector sites, poly gate layer and contacts. Also, doping choices and levels as well as gate oxide thickness and island thickness can be modified. Operating voltages and currents can also be used to optimize performance. All such variations are envisioned in this invention. Also, any silicon or Si/Ge layers which support MOS devices on any insulator can be used.

Thus, the scope of the invention should be determined by the appended claims and their legal equivalents, rather than by the foregoing description and examples given. All changes which come within the meaning and range of equivalency of the claims are to be embraced within their scope.

What is claimed is:

1. A semiconductor device comprising:
   an island of semiconductor material on an insulating substrate;
   a first electronic device of a first conductivity type fabricated in said island of semiconductor material, said first electronic device comprising:
      a first device source region;
      a first device drain region; and
      a first device channel region positioned between said first device source region and said first device drain region, wherein a portion of said first device channel region forms a part of a common channel region;
   a second electronic device of a second conductivity type fabricated in said island of semiconductor material, said second electronic device comprising:
      a second device source region;
      a second device drain region; and
      a second device channel region positioned between said second device source region and said second device drain region, wherein a portion of said second device channel region forms another part of said common channel region; and
   a common floating gate positioned over said common channel region formed by portions of said first and second device channel regions.

2. A semiconductor device as defined in claim 1, wherein said common floating gate comprises:
   a gate insulating layer positioned adjacent said common channel region; and
   a gate conductive layer positioned adjacent said gate insulating layer.

3. A semiconductor device as defined in claim 2 wherein said gate insulating layer comprises an oxide layer and said gate conductor layer comprises a polysilicon layer.

4. A semiconductor device as defined in claim 1, wherein said common floating gate comprises an injector having a region that penetrates into said common channel region and is surrounded by said common channel region.

5. A semiconductor device as defined in claim 1, wherein said semiconductor device comprises an Electrically Erasable Programmable Read Only Memory (EEPROM) device.

6. A semiconductor device as defined in claim 1 wherein said semiconductor material comprises silicon.

7. A semiconductor device as defined in claim 1 wherein said insulating substrate comprises sapphire.

8. A semiconductor device as defined in claim 1 wherein said insulating substrate comprises a layer of silicon dioxide.

9. A semiconductor device comprising:
   a first island of semiconductor material on an insulating substrate wherein said first island of semiconductor material further comprises:
      a first region and a second region of a first conductivity type separated by a first channel region positioned between said first and second regions; and
      a third region of a second conductivity type which is adjacent to said first channel region;
   a second island of semiconductor material on said insulating substrate wherein said second island of semiconductor material further comprises a fourth region and a fifth region of said first conductivity type separated by a second channel region positioned between said fourth and fifth regions;
   a third island of semiconductor material on said insulating substrate wherein said third island of semiconductor material further comprises:
      a sixth region and a seventh region of said first conductivity type separated by a third channel region positioned between said sixth and seventh regions; and
      an eighth region of said second conductivity type which is adjacent to said third channel region; and
   a floating gate common to said first, second and third channel regions, said common floating gate further comprising:
      a gate insulating layer positioned adjacent said first, second and third channel regions; and
      a gate conductive layer positioned adjacent said gate insulating layer.

10. A semiconductor device as defined in claim 9 further comprising an injector, said injector comprising a region wherein said common floating gate penetrates into at least one of said first, second or third channel regions.

11. A semiconductor device as defined in claim 9 wherein said semiconductor material further comprises silicon.

12. A semiconductor device as defined in claim 9 wherein said insulating substrate further comprises sapphire.

13. A semiconductor device as defined in claim 9 wherein said insulating substrate further comprises a layer of silicon dioxide.

14. A multiport semiconductor device comprising:
   an island of semiconductor material on an insulating substrate wherein said island of semiconductor material further comprises:
      a first region and a second region of a first conductivity type separated by a first channel region positioned between said first and second regions;
      a third region of a second conductivity type which is adjacent to said first channel region;
      a fourth region and a fifth region of said first conductivity type separated by a second channel region positioned between said fourth and fifth regions;
      a sixth region of said second conductivity type which is adjacent to said second channel region; and
   a floating gate common to said first and second channel regions.

15. A semiconductor device as defined in claim 14 wherein said common floating gate further comprises:
   a gate insulating layer positioned adjacent said first and second channel regions; and
   a gate conductive layer positioned adjacent said gate insulating layer.

16. A semiconductor device as defined in claim 14 further comprising an injector, said injector comprising a region wherein said common floating gate penetrates into at least one of said first or second-channel regions.

17. A semiconductor device as defined in claim 14 wherein said semiconductor material further comprises silicon.

18. A semiconductor device as defined in claim 14 wherein said insulating substrate further comprises sapphire.

19. A semiconductor device as defined in claim 14 wherein said insulating substrate further comprises a layer of silicon dioxide.

20. An EEPROM cell with integrated inverter serving as a latching sense amplifier semiconductor device, said device comprising:
- an EEPROM cell formed on a first island of semiconductor material on an insulating substrate wherein said EEPROM cell further comprises:
  - a first region and a second region of a first conductivity type separated by a first channel region positioned between said first and second regions; and
  - a third region of a second conductivity type which is adjacent to said first channel region;
- an inverter configured as a latching sense amplifier comprising:
  - a second island of semiconductor material on said insulating substrate wherein said second island of semiconductor material further comprises a fourth region and a fifth region of said first conductivity type separated by a second channel region positioned between said fourth and fifth regions; and
  - a third island of semiconductor material on said insulating substrate wherein said third island of semiconductor material further comprises a sixth region and a seventh region of said second conductivity type separated by a third channel region positioned between said sixth and seventh regions, wherein a voltage $V_{ss}$ is applied to said fourth region of first conductivity type, a voltage $V_{dd}$ is applied to said sixth region of second conductivity type, and said fifth region of first conductivity type and said seventh region of second conductivity type are interconnected as an output for said latching sense amplifier; and
- a floating gate common to said first, second and third channel regions.

21. A semiconductor device as defined in claim 20 further comprising an injector, said injector comprising a region wherein said common floating gate penetrates into one or more of said first, second or third channel regions.

22. A semiconductor device as defined in claim 20 wherein said semiconductor material further comprises silicon.

23. A semiconductor device as defined in claim 20 wherein said insulating substrate further comprises sapphire.

24. A semiconductor device as defined in claim 20 wherein said insulating substrate further comprises a layer of silicon dioxide.

25. An EEPROM cell with integrated NAND gate semiconductor device, said device comprising:
- a first EEPROM cell formed on a first island of semiconductor material on an insulating substrate wherein said first EEPROM cell further comprises:
  - a first region and a second region of a first conductivity type separated by a first channel region positioned between said first and second regions; and
  - a third region of a second conductivity type which is adjacent to said first channel region;
- a second EEPROM cell formed on a second island of semiconductor material on said insulating substrate wherein said second EEPROM cell further comprises:
  - a fourth region and a fifth region of said first conductivity type separated by a second channel region positioned between said fourth and fifth regions; and
  - a sixth region of said second conductivity type which is adjacent to said second channel region;
- a third island of semiconductor material on said insulating substrate wherein said third island of semiconductor material further comprises a seventh region, an eighth region and a ninth region of said first conductivity type wherein said seventh and eighth regions are separated by a third channel region positioned between said seventh and eighth regions and said eighth and ninth regions are separated by a fourth channel region positioned between said eighth and ninth regions;
- a fourth island of semiconductor material on said insulating substrate wherein said fourth island of semiconductor material further comprises a tenth region, an eleventh region and a twelfth region of said second conductivity type wherein said tenth and eleventh regions are separated by a fifth channel region positioned between said tenth and eleventh regions and said eleventh and twelfth regions are separated by a sixth channel region positioned between said eleventh and twelfth regions, wherein a voltage $V_{ss}$ is applied to said seventh region of first conductivity type, a voltage $V_{dd}$ is applied to said tenth region of second conductivity type, and said ninth region of said first conductivity type and said eleventh region of said second conductivity type are interconnected as an output for a NAND logic function;
- a first floating gate common to said first, third and fifth channel regions; and
- a second floating gate common to said second, fourth and sixth channel regions.

26. A semiconductor device as defined in claim 25 further comprising at least one injector, said injector comprising a region wherein either one or both of said first common floating gate or said second common floating gate penetrates into said first or second channel region, respectively.

27. A semiconductor device as defined in claim 25 wherein said semiconductor material further comprises silicon.

28. A semiconductor device as defined in claim 25 wherein said insulating substrate further comprises sapphire.

29. A semiconductor device as defined in claim 25 wherein said insulating substrate further comprises a layer of silicon dioxide.

30. A semiconductor device comprising:
- an island of semiconductor material on an insulating substrate wherein said island of semiconductor material further comprises:
  - a first region and a second region of a first conductivity type separated by a channel region positioned between said first and second regions; and
  - a third region of a second conductivity type which is adjacent to said channel region; and
- a floating gate positioned over said channel region.

31. A semiconductor device as defined in claim 30, wherein said floating gate comprises an injector having a region that penetrates into said channel region.

32. A semiconductor device as defined in claim 30 wherein said semiconductor material comprises silicon.

33. A semiconductor device as defined in claim 30 wherein said insulating substrate comprises sapphire.

34. A semiconductor device as defined in claim 30 wherein said insulating substrate comprises silicon dioxide.

35. A semiconductor programmable interconnect device, said device comprising:
- an EEPROM cell formed on an island of semiconductor material on an insulating substrate wherein said EEPROM cell further comprises:
  - a first region and a second region of a first conductivity type separated by a first channel region positioned between said first and second regions;

a third region and a fourth region of a second conductivity type separated by a second channel region positioned between said third and fourth regions; and a floating gate common to said first and second channel regions;

a first interconnect in electrical contact with said first region of said first conductivity type; and a second interconnect in electrical contact with said second region of said first conductivity type.

36. A semiconductor device as defined in claim 35 further comprising:

a third interconnect in electrical contact with said third region of said second conductivity type; and a fourth interconnect in electrical contact with said fourth region of said fourth conductivity type.

37. A semiconductor device as defined in claim 35, wherein said floating gate comprises an injector having a region that penetrates into at least one of said first or second channel regions.

38. A semiconductor device as defined in claim 35 wherein said semiconductor material comprises silicon.

39. A semiconductor device as defined in claim 35 wherein said insulating substrate comprises sapphire.

40. A semiconductor device as defined in claim 35 wherein said insulating substrate comprises silicon dioxide.

41. A semiconductor content addressable memory cell (CAM) device comprising:

a first EEPROM cell formed on a first island of semiconductor material on an insulating substrate wherein said first EEPROM cell further comprises:

a first EEPROM cell N-channel device which includes a first N+ region and a second N+ region separated by a first channel region positioned between said first and second N+ regions;

a first EEPROM cell P-channel device which includes a first P+ region and a second P+ region separated by a second channel region positioned between said first and second P+ regions;

a second EEPROM cell formed on a second island of semiconductor material on said insulating substrate wherein said second EEPROM cell further comprises:

a second EEPROM cell N-channel device which includes a third N+ region and a fourth N+ region separated by a third channel region positioned between said third and fourth N+ regions;

a second EEPROM cell P-channel device which includes a third P+ region and a fourth P+ region separated by a fourth channel region positioned between said third and fourth P+ regions;

a common floating gate positioned adjacent said first, second, third and fourth channel regions;

a first interconnect in electrical contact with said first N+ region on said first EEPROM cell and said third P+ region on said second EEPROM cell;

a first P-channel transistor having a first P-channel transistor source contact biased at a voltage $V_{DD}$, a first P-channel transistor drain contact connected to said first interconnect, and a clock signal connected to a first P-channel transistor gate contact;

a second P-channel transistor having a second P-channel transistor source contact connected to said fourth P+ region on said second EEPROM cell, a second P-channel transistor drain contact, biased at $V_{SS}$ and a first input connected to a second P-channel transistor gate contact; and a first N-channel transistor having a first N-channel transistor drain contact connected to said second N+ region on said first EEPROM cell, a first N-channel transistor source contact connected to said second P-channel transistor drain contact and biased at a voltage $V_{SS}$, and a second input connected to a first N-channel transistor gate contact.

42. A semiconductor device as defined in claim 41 further comprising an injector, said injector comprising a region wherein said common floating gate penetrates into one or more of said first, second, third or fourth channel regions.

43. A semiconductor device as defined in claim 41 wherein said semiconductor material further comprises silicon.

44. A semiconductor device as defined in claim 41 wherein said insulating substrate further comprises sapphire.

45. A semiconductor device as defined in claim 41 wherein said insulating substrate further comprises a layer of silicon dioxide.

46. A semiconductor device comprising a first island of semiconductor material on an insulating substrate, wherein said first island of semiconductor material comprises:

a first region and a second region of a first conductivity type separated by a first channel region positioned between said first and second regions;

a third region and a fourth region of a second conductivity type separated by a second channel region positioned between said third and fourth regions; and a floating gate positioned over at least a portion of each of said first and second channel regions.

47. A semiconductor device as defined in claim 46, wherein said floating gate comprises a polysilicon layer.

48. A semiconductor device as defined in claim 46 wherein a portion of each of said first and second channel regions coincide.

49. A semiconductor device as defined in claim 46, wherein said floating gate comprises an injector having a region that penetrates into one or more of said first or second channel regions.

50. A semiconductor device as defined in claim 46 wherein said semiconductor material comprises silicon.

51. A semiconductor device as defined in claim 46 wherein said insulating substrate comprises sapphire.

52. A semiconductor device as defined in claim 46 wherein said insulating substrate comprises silicon dioxide.

53. A semiconductor device comprising:

a first island of semiconductor material on an insulating substrate, said first island comprising:

a first region and a second region of a first conductivity type separated by a first channel region positioned between said first and second region; and a third region and a fourth region of a second conductivity type separated by a second channel region positioned between said third and fourth regions; and an inverter configured as a latching sense amplifier, said inverter comprising:

a second island of semiconductor material on said insulating substrate, said second island of semiconductor material comprising a fifth region and a sixth region of said first conductivity type separated by a third channel region positioned between said fifth and sixth regions; and a third island of semiconductor material on said insulating substrate, said third island of semiconductor material comprising a seventh region and an eighth region of said second conductivity type separated by a fourth channel region positioned between said seventh and eighth regions, wherein a voltage $V_{ss}$ is applied to said fifth region of first conductivity type, a voltage $V_{dd}$ is applied to said seventh region of second conductivity type, and said sixth region of first conductivity type and said eighth region of second conductivity type are interconnected as an output for said latching sense amplifier, wherein said floating gate is positioned over at least a portion of each of said first, second, third and fourth channel regions.

54. A semiconductor device comprising:

an island of semiconductor material on an insulating substrate;

a first electronic device of a first conductivity type fabricated in said island of semiconductor material, said first electronic device comprising:
 a first device source region;
 a first device drain region; and
 a first device channel region positioned between said first device source region and said first device drain region;

a second electronic device of a second conductivity type fabricated in said island of semiconductor material, said second electronic device comprising:
 a second device source region;
 a second device drain region; and
 a second device channel region positioned between said second device source region and said second device drain region; and a floating gate positioned over at least a portion of each of said first device channel region and said second device channel region.

55. A semiconductor device as defined in claim 54, wherein said floating gate comprises a polysilicon layer.

56. A semiconductor device as defined in claim 54 wherein a portion of each of said first device channel region and said second device channel region coincide.

57. A semiconductor device as defined in claim 54, wherein said floating gate comprises an injector having a region that penetrates into one or more of said first device channel region or said second device channel region.

58. A semiconductor device as defined in claim 54 wherein said semiconductor material comprises silicon.

59. A semiconductor device as defined in claim 54 wherein said insulating substrate comprises sapphire.

60. A semiconductor device as defined in claim 54 wherein said insulating substrate comprises silicon dioxide.

61. A semiconductor device comprising:

a layer of semiconductor material on an insulating substrate;

a first electronic device of a first conductivity type fabricated in said layer of semiconductor material, said first electronic device comprising a first region and a second region of said first conductivity type separated by a first channel region positioned between said first and second regions;

a second electronic device of a second conductivity type fabricated in said layer of semiconductor material, said second electronic device comprising a third region and a fourth region of said second conductivity type separated by a second channel region positioned between said third and fourth regions; and a common floating gate positioned over at least a portion of each of said first and second channel regions.

62. A semiconductor device as defined in claim 61, wherein said common floating gate comprises an injector having a region that penetrates into at least one of said first or second channel regions.

63. A semiconductor device as defined in claim 61 wherein said semiconductor material comprises silicon.

64. A semiconductor device as defined in claim 61 wherein said insulating substrate comprises sapphire.

65. A semiconductor device as defined in claim 61 wherein said insulating substrate comprises silicon dioxide.

66. A semiconductor device as defined in claim 61 wherein said first electronic device of said first conductivity type is fabricated in a first island of semiconductor material on said insulating substrate and said second electronic device of said second conductivity type is fabricated in a second island of semiconductor material on said insulating substrate.

67. A semiconductor device as defined in claim 61 wherein said first electronic device of said first conductivity type and said second electronic device of said second conductivity type are fabricated in a single island of semiconductor material on said insulating substrate.

* * * * *

UNITED STATES PATENT AND TRADEMARK OFFICE
CERTIFICATE OF CORRECTION

PATENT NO. : 6,690,056 B1  Page 1 of 1
DATED : February 10, 2004
INVENTOR(S) : Reedy et al.

It is certified that error appears in the above-identified patent and that said Letters Patent is hereby corrected as shown below:

Column 12,
Line 29, "$V_{DS}$ The" should be -- $V_{DS}$. The --;

Column 17,
Line 40, "1OC" should read -- 10C --; and

Column 20
Line 59, "second-channel" should be -- second channel --.

Signed and Sealed this

Fifteenth Day of June, 2004

JON W. DUDAS
*Acting Director of the United States Patent and Trademark Office*